United States Patent [19]

Anderson et al.

[11] Patent Number: 5,732,330

[45] Date of Patent: Mar. 24, 1998

[54] DUAL BAND TRANSCEIVER

[75] Inventors: William David Anderson, Chapel Hill; Frank Thomas Lombardi, Durham, both of N.C.

[73] Assignee: Ericsson Inc., Research Triangle Park, N.C.

[21] Appl. No.: 675,171

[22] Filed: Jul. 2, 1996

[51] Int. Cl.[6] ........................................... H04B 1/44
[52] U.S. Cl. ..................... 455/76; 455/84; 455/86; 455/112; 455/118
[58] Field of Search ........................... 455/75, 76, 78, 455/82, 83, 84, 85, 86, 550, 553, 91, 110, 112, 113, 118, 119

[56] References Cited

U.S. PATENT DOCUMENTS

| 5,127,042 | 6/1992 | Gillig et al. | 379/59 |
|---|---|---|---|
| 5,175,872 | 12/1992 | Borras | 455/76 |
| 5,260,988 | 11/1993 | Schellinger et al. | 379/59 |
| 5,303,287 | 4/1994 | Laborde | 379/59 |
| 5,309,502 | 5/1994 | Hirai | 379/59 |
| 5,367,558 | 11/1994 | Gillig et al. | 379/59 |
| 5,392,462 | 2/1995 | Komaki | 455/89 |
| 5,442,680 | 8/1995 | Schellinger et al. | 379/58 |
| 5,465,409 | 11/1995 | Borras et al. | 455/260 |
| 5,511,236 | 4/1996 | Umstattd et al. | 455/76 |
| 5,519,885 | 5/1996 | Vaisanen | 455/86 |

FOREIGN PATENT DOCUMENTS

| 0 581 573 A1 | 2/1994 | European Pat. Off. | |
|---|---|---|---|
| 03-089721 A | 4/1991 | Japan . | |
| 05-259934 A | 10/1993 | Japan . | |
| 06-61972 | 3/1994 | Japan . | |
| 406132847 | 5/1994 | Japan | 455/78 |
| 06-188781 A | 7/1994 | Japan . | |
| 06-224834 | 8/1994 | Japan . | |
| 06-284033 | 10/1994 | Japan . | |
| 07-74575 | 3/1995 | Japan . | |
| WO 95/24079 | 9/1995 | WIPO . | |

OTHER PUBLICATIONS

McMahan, Mike and McCaffrey, Tim, "Wireless Telephones Don't Go Everywhere –But They May Soon", *Wireless Design & Development*, Apr. 1996, pp. 9–10, 13.

Hitachi Ferrite, Ltd. R&D Center, "Subj.: Hitachi Ferrite's Products for 1.7/1.9 GHz Band Digital Phone", May 8, 1995.

Hewlett Packard, Technical Data, HPMX–2004, Oct. 1993.

*Primary Examiner*—Reinhard J. Eisenzopf
*Assistant Examiner*—Thanh Le
*Attorney, Agent, or Firm*—Robert A. Samra

[57] ABSTRACT

A dual band transceiver for operating in a first lower frequency band such as the band allocated to cellular systems, and in a second higher frequency band such as the band allocated to personal communication services (PCS) systems. In a representative embodiment, the dual band transceiver comprises a main voltage controlled oscillator (VCO) for generating a local oscillator (LO) signal; an offset VCO for generating an offset frequency (OF) signal; a first mixer for combining the LO signal with the OF signal to produce a first transmit signal; a modulator for modulating the first transmit signal with the data signal to produce a first data modulated transmit signal; and a second mixer for combining the first data modulated transmit signal with the LO signal to produce a second data modulated signal. The main VCO and the offset VCO can be programmed such that the first data modulated transmit signal is in the first band and the second data modulated transmit signal is in the second band.

30 Claims, 5 Drawing Sheets

| CELL BAND | BANDWIDTH (MHz) | NUMBER OF CHANNELS | BOUNDARY CHANNELS | TRANSMITTER CENTER FREQUENCY (MHz) | |
|---|---|---|---|---|---|
| | | | | MOBILE | BASE |
| (NOT USED) | | 1 | (990) | (824.010) | (869.010) |
| A" | 1 | 33 | 991 | 824.040 | 869.040 |
| | | | 1023 | 825.000 | 870.000 |
| A | 10 | 333 | 1 | 825.030 | 870.030 |
| | | | 333 | 834.990 | 879.990 |
| B | 10 | 333 | 334 | 835.020 | 880.020 |
| | | | 666 | 844.980 | 889.980 |
| A' | 1.5 | 50 | 667 | 845.010 | 890.010 |
| | | | 716 | 846.480 | 891.480 |
| B' | 2.5 | 83 | 717 | 846.510 | 891.510 |
| | | | 799 | 848.970 | 893.970 |

| PCS BAND | BANDWIDTH (MHz) | NUMBER OF CHANNELS | BOUNDARY CHANNELS | TRANSMITTER CENTER FREQUENCY (MHz) | |
|---|---|---|---|---|---|
| | | | | MOBILE | BASE |
| NOT USED | | 1 | 1 | 1850.010 | 1930.050 |
| A | 15 | 497 | 2<br>498 | 1850.040<br>1864.920 | 1930.080<br>1944.960 |
| A,D | | 1 | 499 | 1864.950 | 1944.990 |
| A,D | | 1 | 500 | 1864.980 | 1945.020 |
| A,D | | 1 | 501 | 1865.010 | 1945.050 |
| D | 5 | 164 | 502<br>665 | 1865.040<br>1869.930 | 1945.080<br>1949.970 |
| D,B | | 1 | 666 | 1869.960 | 1950.000 |
| D,B | | 1 | 667 | 1869.990 | 1950.030 |
| B | 15 | 498 | 668<br>1165 | 1870.020<br>1884.930 | 1950.060<br>1964.970 |
| B,E | | 1 | 1166 | 1884.960 | 1965.000 |
| B,E | | 1 | 1167 | 1884.990 | 1965.030 |
| E | 5 | 165 | 1168<br>1332 | 1885.020<br>1889.940 | 1965.060<br>1969.980 |
| E,F | | 1 | 1333 | 1889.970 | 1970.010 |
| E,F | | 1 | 1334 | 1890.000 | 1970.040 |
| F | 5 | 164 | 1335<br>1498 | 1890.030<br>1894.920 | 1970.070<br>1974.960 |
| F,C | | 1 | 1499 | 1894.950 | 1974.990 |
| F,C | | 1 | 1500 | 1894.980 | 1975.020 |
| F,C | | 1 | 1501 | 1895.010 | 1975.050 |
| C | 15 | 497 | 1502<br>1998 | 1895.040<br>1909.920 | 1975.080<br>1989.960 |
| NOT USED | | 1 | 1999 | 1909.950 | 1989.990 |

*FIG. 4*

DUAL BAND TRANSCEIVER

BACKGROUND OF THE INVENTION

1. Field of the Invention

The present invention relates to wireless communication systems and, more particularly, to dual band mobile stations which must be able to transmit and receive in two separate frequency bands used by such systems, such as the bands used for providing cellular telephone services and personal communication services (PCS), respectively.

2. History of the Prior Art

The prior art includes cellular radio systems which have been operating in the United States since the early 1980s, and providing telephone service to an ever growing subscriber base, presently estimated at over 20 million subscribers. Cellular telephone service operates much like the fixed, wireline telephone service in homes and offices, except that radio frequencies rather than telephone wires are used to connect telephone calls to and from the mobile subscribers. Each mobile subscriber is assigned a private (10 digit) directory telephone number and is billed based on the amount of "airtime" he or she spends talking on the cellular telephone each month. Many of the service features available to landline telephone users (e.g., call waiting, call forwarding, three-way calling, etc.) are also generally available to mobile subscribers.

In the United States, cellular operating licenses have been awarded by the Federal Communications Commission (FCC) pursuant to a licensing scheme which divided the country into geographic service markets defined according to the 1980 Census. The major metropolitan markets are called metropolitan statistical areas (MSAs) while the smaller rural markets are called rural statistical areas (RSAs). Only two cellular licenses are awarded for operating systems in each market. These two systems were initially allocated two different radio frequency (RF) blocks in the 800 MHz range, called the "A band" and the "B band," respectively. The two cellular systems in each market, therefore, are commonly referred to as the "A system" and the "B system," respectively. To meet the needs of the growing number of mobile subscribers, however, the FCC subsequently released additional blocks of spectrum in the 800 MHz range to the A and B systems, those additional RF blocks being designated as the "A' and A" bands" (for the A system), and the "B' band" (for the B system). Each of the A, A', and A" bands (for the A system) and the B and B' bands (for the B system) actually consists of two corresponding bands, one for transmitting and another for receiving, separated by 45 MHz. Each of the transmit and receive bands, in turn, is divided into a number of RF channels spaced by 30 KHz. Thus, each RF channel consists of a 30 KHz transmit channel and a corresponding 30 KHz receive channel separated by 45 MHz within the 800 MHz range.

The architecture for a typical cellular radio system is shown in FIG. 1. A geographical area (e.g., a metropolitan area) is divided into several smaller, contiguous radio coverage areas, called "cells," such as cells C1–C10. The cells C1–C10 are served by a corresponding group of fixed radio stations, called "base stations," B1–B10, each of which operates on a subset of the RF channels assigned to the system. For illustration purposes, the base stations B1–B10 are shown in FIG. 1 to be located at the center of the cells C1–C10, respectively, and are shown to be equipped with omni-directional antennas transmitting equally in all directions. However, the base stations B1–B10 may also be located near the periphery or otherwise away from the centers of the cells C1–C10, and may illuminate the cells C1–C10 with radio signals directionally (e.g., a base station may be equipped with three directional antennas each covering a 120 degrees sector).

The RF channels allocated to any given cell (or sector) may be reallocated to a distant cell in accordance with a frequency reuse pattern as is well known in the art. In each cell (or sector), at least one RF channel is used to carry control or supervisory messages, and is called the "control" or "paging/access" channel. The other RF channels are used to carry voice conversations, and are called the "voice" or "speech" channels. The cellular telephone users (mobile subscribers) in the cells C1–C10 are provided with portable (hand-held), transportable (hand-carried) or mobile (car-mounted) telephone units, collectively referred to as "mobile stations," such as mobile stations M1–M5, each of which communicates with a nearby base station.

With continuing reference to FIG. 1, the base stations B1–B10 are connected to and controlled by a mobile telephone switching office (MTSO) 20. The MTSO 20, in turn, is connected to a central office (not specifically shown in FIG. 1) in the landline (wireline) public switched telephone network (PSTN) 30, or to a similar facility such as an integrated system digital network (ISDN). The MTSO 20 switches calls between wireline and mobile subscribers, controls signalling to the mobile stations, compiles billing statistics, stores subscriber service profiles, and provides for the operation, maintenance and testing of the system.

Access to a cellular system by any of the mobile stations M1–M5 is controlled on the basis of a mobile identification number (MIN) and an electronic serial number (ESN) which are stored in the mobile station. The MIN is a digital representation of the 10-digit directory telephone number assigned to each mobile subscriber by the home system operator. The electronic serial number (ESN) is assigned by the manufacturer and permanently stored in the mobile station. The MIN/ESN pair is sent from the mobile station when originating a call and its validity is checked by the MTSO 20. If the MIN/ESN pair is determined to be invalid (e.g., if the ESN has been blacklisted because the mobile station was reported to be stolen), the system may deny access to the mobile station. The MIN is also sent from the system to the mobile station when alerting the mobile station of an incoming call.

When turned on (powered up), each of the mobile stations M1–M5 enters the idle state (standby mode) and tunes to and continuously monitors the strongest control channel (generally, the control channel of the cell in which the mobile station is located at that moment). When moving between cells while in the idle state, the mobile station will eventually "lose" radio connection on the control channel of the "old" cell and tune to the control channel of the "new" cell. The initial tuning to, and the change of, control channel are both accomplished automatically by scanning all the control channels in operation in the cellular system to find the "best" control channel (in the United States, there are 21 "dedicated" control channels in each cellular system which means that the mobile station has to scan a maximum number of 21 RF channels). When a control channel with good reception quality is found, the mobile station remains tuned to this channel until the quality deteriorates again. In this manner, the mobile station remains "in touch" with the system and may receive or initiate a telephone call through one of the base stations B1–B10 which is connected to the MTSO 20.

To detect incoming calls, the mobile station continuously monitors the current control channel to determine whether a page message addressed to it (i.e., containing its MIN) has been received. A page message will be sent to the mobile station, for example, when an ordinary (landline) subscriber calls the mobile subscriber. The call is directed from the PSTN 30 to the MTSO 20 where the dialed number is analyzed. If the dialed number is validated, the MTSO 20 requests some or all of the base stations B1–B10 to page the called mobile station throughout their corresponding cells C1–C10. Each of the base stations B1–B10 which receive the request from the MTSO 20 will then transmit over the control channel of the corresponding cell a page message containing the MIN of the called mobile station. Each of the idle mobile stations M1–M5 which is present in that cell will compare the MIN in the page message received over the control channel with the MIN stored in the mobile station. The called mobile station with the matching MIN will automatically transmit a page response over the control channel to the base station, which then forwards the page response to the MTSO 20. Upon receiving the page response, the MTSO 20 selects an available voice channel in the cell from which the page response was received (the MTSO 20 maintains an idle channel list for this purpose), and requests the base station in that cell to order the mobile station via the control channel to tune to the selected voice channel. A through-connection is established once the mobile station has tuned to the selected voice channel.

When, on the other hand, a mobile subscriber initiates a call (e.g., by dialing the telephone number of an ordinary subscriber and pressing the "send" button on the telephone handset in the mobile station), the dialed number and MIN/ESN pair for the mobile station are sent over the control channel to the base station and forwarded to the MTSO 20, which validates the mobile station, assigns a voice channel and establishes a through-connection for the conversation as described before. If the mobile station moves between cells while in the conversation state, the MTSO 20 will perform a "handoff" of the call from the old base station to the new base station. The MTSO 20 selects an available voice channel in the new cell and then orders the old base station to send to the mobile station on the current voice channel in the old cell a handoff message which informs the mobile station to tune to the selected voice channel in the new cell. The handoff message is sent in a "blank and burst" mode which causes a short but hardly noticeable break in the conversation. Upon receipt of the handoff message, the mobile station tunes to the new voice channel and a through-connection is established by the MTSO 20 via the new cell. The old voice channel in the old cell is marked idle in the MTSO 20 and may be used for another conversation.

The original cellular radio systems, as described above, use analog transmission methods, specifically frequency modulation (FM), and duplex (two-way) RF channels in accordance with the Advanced Mobile Phone Service (AMPS) standard. According to the AMPS standard, each control or voice channel between the base station and the mobile station uses a pair of separate frequencies (in the A, A', A", B or B' bands, as applicable) consisting of a forward (downlink) frequency for transmission by the base station (reception by the mobile station) and a reverse (uplink) frequency for transmission by the mobile station (reception by the base station). The AMPS system, therefore, is a single-channel-per-carrier (SCPC) system allowing for only one voice circuit (telephone conversation) per RF channel. Different users are provided access to the same set of RF channels with each user being assigned a different RF channel (pair of frequencies) in a technique known as frequency division multiple access (FDMA). This original AMPS (analog) architecture forms the basis for an industry standard sponsored by the Electronics Industries Association (EIA) and the Telecommunication Industry Association (TIA), and known as EIA/TIA-553.

In the late 1980s, however, the cellular industry in the United States began migrating from analog to digital technology, motivated in large part by the need to address the steady growth in the subscriber population and the increasing demand on system capacity. It was recognized early on that the capacity improvements sought for the next generation cellular systems could be achieved by either "cell splitting" to provide more channels per subscribers in the specific areas where increased capacity is needed, or by the use of more advanced digital radio technology in those areas, or by a combination of both approaches. According to the first approach (cell splitting), by reducing the transmit power of the base station, the size of the corresponding cell (or cell radius) and, with it, the frequency reuse distance are reduced thereby resulting in more channels per geographic area (i.e., increased capacity). Additional benefits of a smaller cell include a longer "talk time" for the user since the mobile station will use substantially lower transmit power than in a larger cell and, consequently, its battery will not need to be recharged as often. As is well known in the art, cell splitting creates progressively smaller cells, known as "macrocells," "microcells" and "picocells," within the coverage area of a conventional cellular telephone system. In this cellular hierarchy, a macrocell (which usually has a radius of at least 1 Km) may serve, for example, rapidly moving users and cover low to medium usage areas. A microcell may serve the slowly moving users and cover high-density pedestrian areas (e.g., a convention center or a busy downtown street) or busy thorough-fares (streets or highways). A picocell may cover an office corridor or a floor of a high rise building.

From a system (MTSO) perspective, the base stations in the microcells and picocells can be viewed as extensions of the base stations in adjoining or overlapping macrocells. In this case, the microcell and picocell base stations may be connected to the macrocell base station via digital transmission lines, for example. Alternatively, the microcells and picocells may be treated just like macrocells and be connected directly to the MTSO. From a radio coverage perspective, the macrocells, microcells and picocells may be distinct from each other or, alternatively, overlaid one on top of the other to handle different traffic patterns or radio environments. For example, handoff between microcells may sometimes be difficult to perform around street corners, particularly where the users are moving so rapidly that the signal strength variations are in excess of 20 dB per second. In this situation, it may be possible to use an "umbrella" macrocell for the rapidly moving users and to use microcells for the slowly moving users. By managing different types of users differently in this way, handoff between microcells may be avoided for the rapidly moving users which are subject to the severe street corner effects. Thus, in general, the concept of cell splitting is useful not only for covering "hot spots" (areas with heavy localized traffic) but also "dead spots" (areas where topography or zoning or other restrictions prevent penetration of radio signals).

While cell splitting held the promise of improving both capacity and coverage for the growing subscriber base, the actual capacity gains were limited by the use of the analog AMPS technology. It was commonly believed that the desired capacity gains, and indeed the effectiveness of the microcellular (cell splitting) concept in increasing capacity, can be maximized only by the use of digital technology. Thus, in an effort to go digital, the EIA/TIA developed a number of air interface standards which use digital voice encoding (analog-to-digital conversion and voice compression) and time division multiple access (TDMA) or code division multiple access (CDMA) techniques to multiply the number of voice circuits (conversations) per RF channel (i.e., to increase capacity). These standards include IS-54 (TDMA) and IS-95 (CDMA), both of which are "dual mode" standards in that they support the use of the original AMPS analog voice and control channels in addition to digital speech channels defined within the existing AMPS framework (so as to ease the transition from analog to digital and to allow the continued use of existing analog mobile stations). The dual-mode IS-54 standard, in particular, has become known as the digital AMPS (D-AMPS) standard. A related standard, known as IS-55A, specifies the minimum performance requirements for IS-54 compatible mobile station. More recently, the EIA/TIA has developed a new specification for D-AMPS, which includes a digital control channel suitable for supporting public or private microcell operation, extended mobile station battery life, and enhanced end-user features. This new specification builds on the IS-54B standard (the current revision of IS-54), and it is known as IS-136. A related standard, which specifies the minimum performance requirements for IS-136 compatible mobile stations, is currently under development and is known as IS-137A. All of the foregoing EIA/TIA standards are hereby incorporated herein by reference as may be necessary for a full understanding of these background developments (copies of these standards may be obtained from the Electronics Industries Association; 2001 Pennsylvania Avenue, N.W.; Washington, D.C. 20006).

Along with the shift to digital technology in the last few years, there has been an increasing shift towards the use of lightweight pocket telephones in homes, offices, public meeting places, and in virtually any other place where the user may desire to obtain telephone service. The cellular telephone system of FIG. 1 had its origin in the provision of car telephone service. The next step in the evolution of wireless telephony is the emerging concept of "personal communication services" (PCS). The goal of PCS is to support the communication not only of telephone calls, but also facsimile, computer data, paging and text messages, and even video signals to a user moving around, for example, at walking speeds inside a building, a factory, a warehouse, a shopping mall, a convention center, an airport, or any other indoor or outdoor area. PCS systems use digital technology (e.g., TDMA as specified in IS-136 or the European GSM standard), operate on lower power, and use smaller cellular structures (i.e., microcells), as compared with the conventional wide area (vehicular) analog cellular systems, so as to provide the high-quality, high-capacity radio coverage needed for private business and other applications. Thus, PCS systems are believed to combine the advantages of digital technology and microcellular architecture, while offering a wide variety of value-added features. The FCC recently auctioned spectrum in the 1900 MHz range for use by PCS systems. Six blocks of frequencies, called the "A-F bands," have been specified within the 1900 MHz range, with each band being divided into duplex RF channels spaced by 30 KHz, in a manner similar to the channel allocation for the 800 MHz range used by cellular systems, except that the transmit-receive frequency separation for PCS systems is 80.04 MHz instead of 45 MHz.

Thus, the wireless landscape for the foreseeable future will include both cellular systems operating in the 800 MHz range (hereinafter sometimes referred to as the "cell band"), and PCS systems operating in the 1900 MHz range (hereinafter sometimes referred to as the "PCS band"). Consequently, mobile subscribers who desire to receive services from both types of systems must either use two different mobile stations capable of operating within the cell band and PCS band, respectively, or preferably, a single "dual band" mobile station which can operate in both bands. One approach to designing such a dual band mobile station is to use completely separate radio hardware for the cell and PCS bands, respectively. However, this approach would increase the size and cost of the mobile station. To minimize the size and cost of the dual band mobile station, as much of the hardware used for operation in the cell band should be reused for operation in the PCS band. In addition, it is desirable to modify the design of existing D-AMPS mobile stations, for example, in a manner which can easily and inexpensively provide for operation in the newer PCS band so as to facilitate the early introduction of dual band mobile stations into the marketplace. These objectives are met by the present invention.

SUMMARY OF THE INVENTION

The present invention allows the sharing of most radio hardware in the transmit and receive paths, respectively, between the cell band and the PCS band. A dual band mobile station constructed in accordance with the present invention, for example, can use a single local oscillator and a single modulator. Furthermore, according to the present invention, the design of existing mobile stations incorporating hardware for operation in the cell band can be readily modified with minimal additional hardware for also enabling operation in the PCS band.

In one aspect, the present invention provides a dual band transmitter for transmitting a data signal in a first lower frequency band such as the cell band, or a second higher frequency band such as the PCS band. The dual band transmitter comprises a first oscillating means for generating a local oscillator (LO) signal; a second oscillating means for generating an offset frequency (OF) signal; a first mixing means for combining the LO signal with the OF signal to produce a first transmit signal; modulation means for modulating the first transmit signal with the data signal to produce a first data modulated transmit signal; a second mixing means for combining the first data modulated transmit signal with the LO signal to produce a second data modulated transmit signal; means for programming the first oscillating means and the second oscillating means such that the first data modulated transmit signal is in the first band and the second data modulated transmit signal is in the second band; and means for transmitting the first data modulated transmit signal when transmitting in the first band, and for transmitting the second data modulated transmit signal when transmitting in the second band.

In an alternative embodiment of the dual band transmitter of the present invention, the modulation means modulates one of the LO signal and the OF signal with the data signal to produce a data modulated signal; and the first mixing means combines the other of the LO signal and the OF signal with the data modulated signal to produce the first data modulated transmit signal. In each of these embodiments of the dual band transmitter, the data signal can be selectively transmitted in the cell band or the PCS band by setting the LO signal to a frequency between 980 MHz and 1050 MHz, and by setting the OF signal to 155.52 MHz when transmitting in the cell band and resetting it to 190.56 MHz when transmitting in the PCS band.

In another aspect, the present invention provides a dual band mobile station capable of operating in a first lower frequency band such as the cell band, or a second higher frequency band such as the PCS band. The dual band mobile station comprises means for detecting an analog voice signal; means for processing the analog voice signal into a digital baseband data signal; and dual band transmitting means for transmitting the baseband data signal in the first band or the second band. The dual band transmitting means includes a first oscillating means for generating a local oscillator (LO) signal; a second oscillating means for generating an offset frequency (OF) signal; a first mixing means for combining the LO signal with the OF signal to produce a first transmit signal; modulation means for modulating the first transmit signal with the baseband data signal to produce a first data modulated transmit signal; a second mixing means for combining the first data modulated transmit signal with the LO signal to produce a second data modulated transmit signal; means for programming the first oscillating means and the second oscillating means such that the first data modulated transmit signal is in the first band and the second data modulated transmit signal is in the second band; and means for transmitting the first data modulated transmit signal when transmitting in the first band, and for transmitting the second data modulated transmit signal when transmitting in the second band.

In an alternative embodiment of the dual band mobile station of the present invention, the modulation means modulates one of the LO signal and the OF signal with the baseband data signal to produce a data modulated signal; and the first mixing means combines the other of the LO signal and the OF signal with the data modulated signal to produce the first data modulated transmit signal. In each of these embodiments of the dual band mobile station, the dual band mobile station may further comprise dual band receiving means for receiving a data modulated signal in the first or second band. The dual band receiving means includes a third mixing means for combining the received first band signal with the LO signal; a frequency multiplier such as a frequency doubler for upconverting the LO signal; and a fourth mixing means for combining the received second band signal with the upconverted LO signal.

In yet another aspect, the present invention provides a method for transmitting a data signal in a first lower frequency band such as the cell band, or a second higher frequency band such as the PCS band. The method comprises the steps of generating a local oscillator (LO) signal; generating an offset frequency (OF) signal; mixing the LO signal with the OF signal to produce a first transmit signal; modulating the first transmit signal with the data signal to produce a first data modulated signal; if the data signal is to be transmitted in the first band, selecting the LO signal and the OF signal such that the first data modulated transmit signal is in the first band, and transmitting the data modulated first band signal; and if the data signal is to be transmitted in the second band, mixing the first data modulated transmit signal with the LO signal to produce a second data modulated transmit signal, selecting the LO signal and the OF signal such that the second data modulated transmit signal is in the second band, and transmitting the second data modulated transmit signal.

In an alternative embodiment of the dual band transmission method of the present invention, one of the LO signal and the OF signal is modulated with the data signal to produce a data modulated signal; and the other of the LO signal and the OF signal is mixed with the data modulated signal to produce the first data modulated transmit signal. In each of these embodiments of the inventive method, the first data modulated transmit signal may be filtered before being mixed with the LO signal to produce the second data modulated transmit signal. This filtering acts to limit spurious emissions in the transmission of the second data modulated transmit signal.

BRIEF DESCRIPTION OF THE DRAWINGS

The present invention will be better understood and its numerous objects and advantages will become apparent to those skilled in the art by reference to the following drawings in which:

FIG. 4 shows the channel allocation within the PCS frequency bands of FIG. 2;

DETAILED DESCRIPTION

Figure 1:
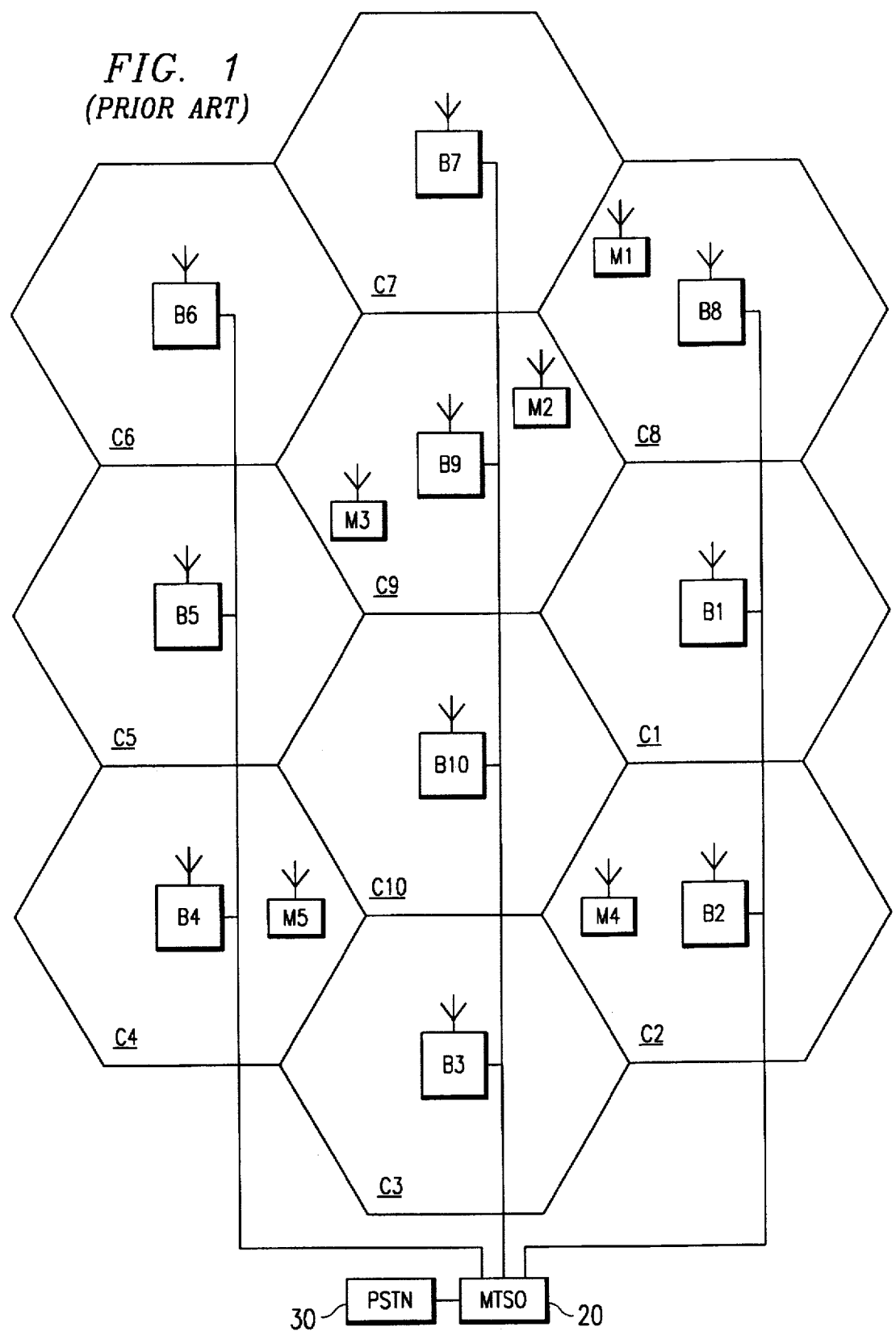
FIG. 1 shows the architecture of a conventional cellular telephone system.
Figures 2, 3:
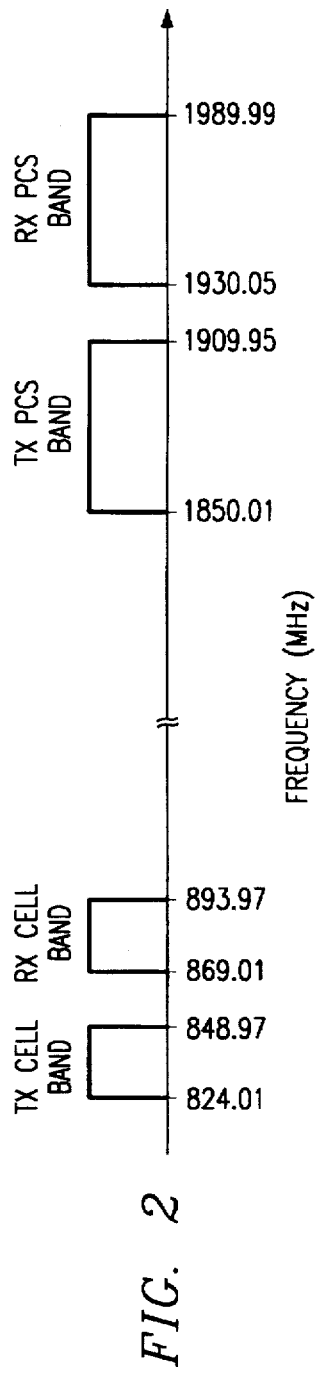
FIG. 2 shows the transmit and receive frequency bands for cellular telephone systems as specified in IS-55A, a known industry standard, and for personal communication services (PCS) systems as specified in IS-137A, another known industry standard which is currently under development.
FIG. 3 shows the channel allocation within the cellular frequency bands of FIG. 2.

Referring first to FIG. 2, the cell band spans frequencies in the range from 824 MHz to 894 MHz, and consists of a transmit cell band extending from 824 MHz to 849 MHz and a corresponding receive cell band extending from 869 MHz to 894 MHz. The PCS band, on the other hand, spans frequencies in the range from 1850 MHz to 1990 MHz, and consists of a transmit PCS band extending from 1850 MHz to 1910 MHz and a corresponding receive PCS band extending from 1930 MHz to 1990 MHz. As shown in FIG. 3, each of the RF channels in the cell band is associated with a particular channel number, and consists of a transmit center frequency (mobile station to base station) and a corresponding receive center frequency (base station to mobile station) separated by 45 MHz. As shown in FIG. 4, each of the RF channels in the PCS band is also associated with a particular channel number, and consists of a transmit center frequency (mobile station to base station) and a corresponding receive center frequency (base station to mobile station) separated by 80.04 MHz. It will be noted that while each of the RF channels used in the cell band falls into a single one of the A, A', A", B or B' bands (FIG. 3), some of the RF channels used in the PCS band (channel numbers 499–501, 666–667, 1166–1167, 1333–1334, and 1499–1501) actually fall into more than one of the A–F bands (FIG. 4).

Figure 5:
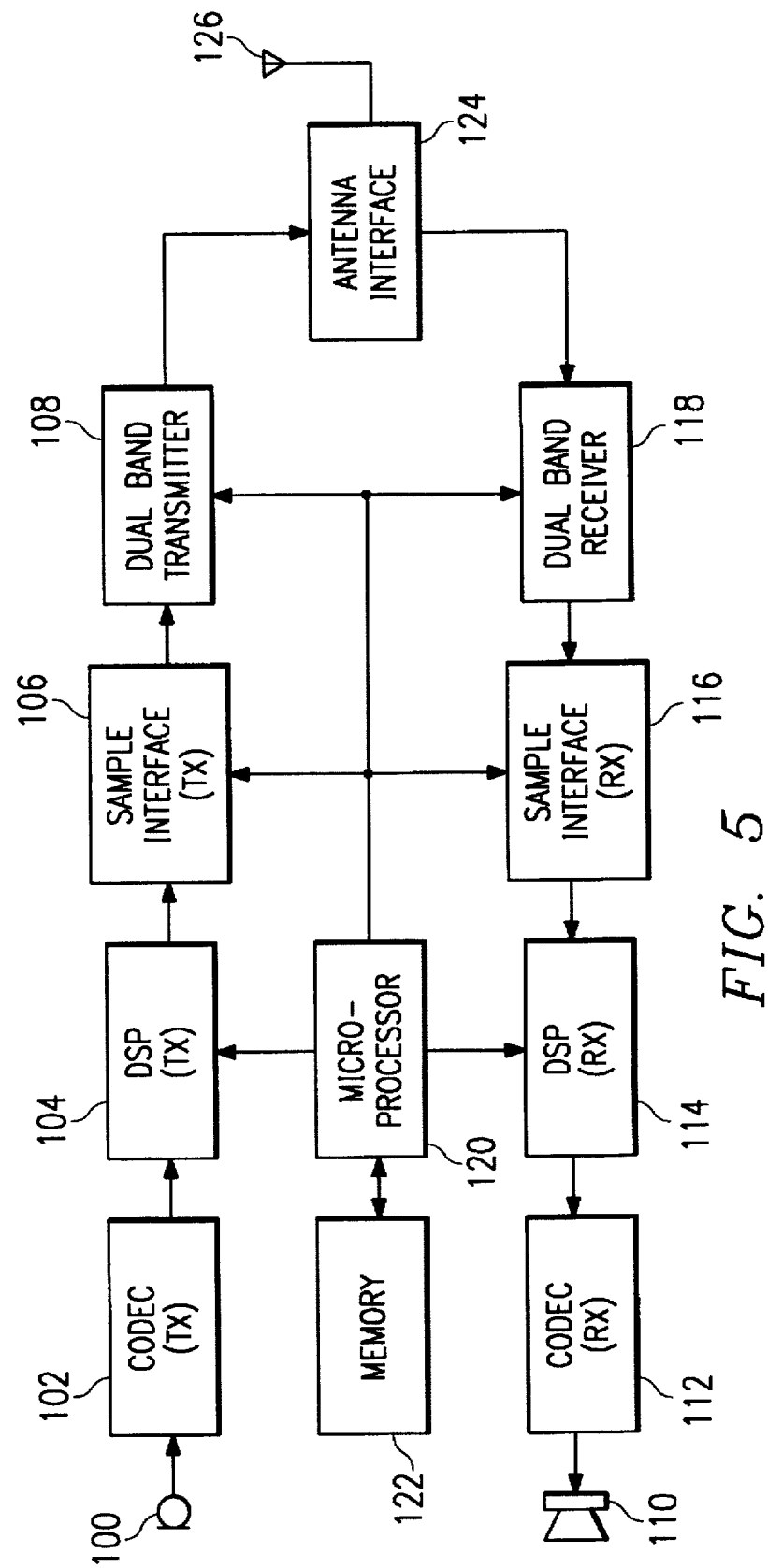
FIG. 5 is a block diagram of a mobile station including a dual band transceiver constructed in accordance with the present invention.

Referring next to FIG. 5, there is shown a simplified block diagram of a dual band mobile station constructed in accordance with the present invention. The mobile station comprises a transmit section (upper half of FIG. 5) and a receive section (lower half of FIG. 5). The transmit section includes a microphone 100, a codec 102, a digital signal processor (DSP) 104, a sample interface 106 and a dual band transmitter 108. The receive section is essentially the mirror image of the transmit section and includes a speaker 110, a codec 112, a DSP 114, a sample interface 116 and a dual band receiver 118. The DSPs 104 and 114, sample interfaces 106 and 116, and dual band transmitter-receiver (transceiver) 108 and 118 are controlled by a microprocessor 120 which can access a memory 122 containing software for the transmit and receive operations of the mobile station. The dual band transmitter 108 and the receiver 118 are connected through an antenna interface 124 to an antenna 126.

In the transmit operation, audio (analog) signals detected by the microphone 100 are converted to digital speech samples (data) in the transmit codec 102 and sent to the transmit DSP 104 which performs gain control, filtering, voice compression, channel coding and any other desired processing of speech and control data (e.g., in accordance with IS-136). The processed baseband data is then sent to the transmit sample interface 106 which forms a modulation waveform consisting of an in-phase (I) signal and an out-of-phase (Q) signal, as will be readily appreciated by persons of ordinary skill in the art. The baseband I and Q modulation waveforms are fed to the dual band transmitter 108 where they are modulated onto an analog carrier signal, up-converted to the selected channel frequency as needed, filtered, amplified, passed through the antenna interface 124, and then finally transmitted through the antenna 126.

In the receive operation, the modulated carrier signal received by the antenna 126 is passed through the antenna interface 124 to the dual band receiver 118 where it is down-converted to an intermediate frequency (IF) signal. The amplitude, phase and/or frequency of the IF signal is then sampled in the sample interface 116 and the sample data is sent to the receive DSP 114 for processing. The DSP 114 performs demodulation, filtering, gain/attenuation, channel decoding and decompression of the sample data. The demodulated and decompressed data is then sent to the receive codec 112 where it is converted to a baseband audio signal which is output through the loudspeaker 110.

Figure 6:
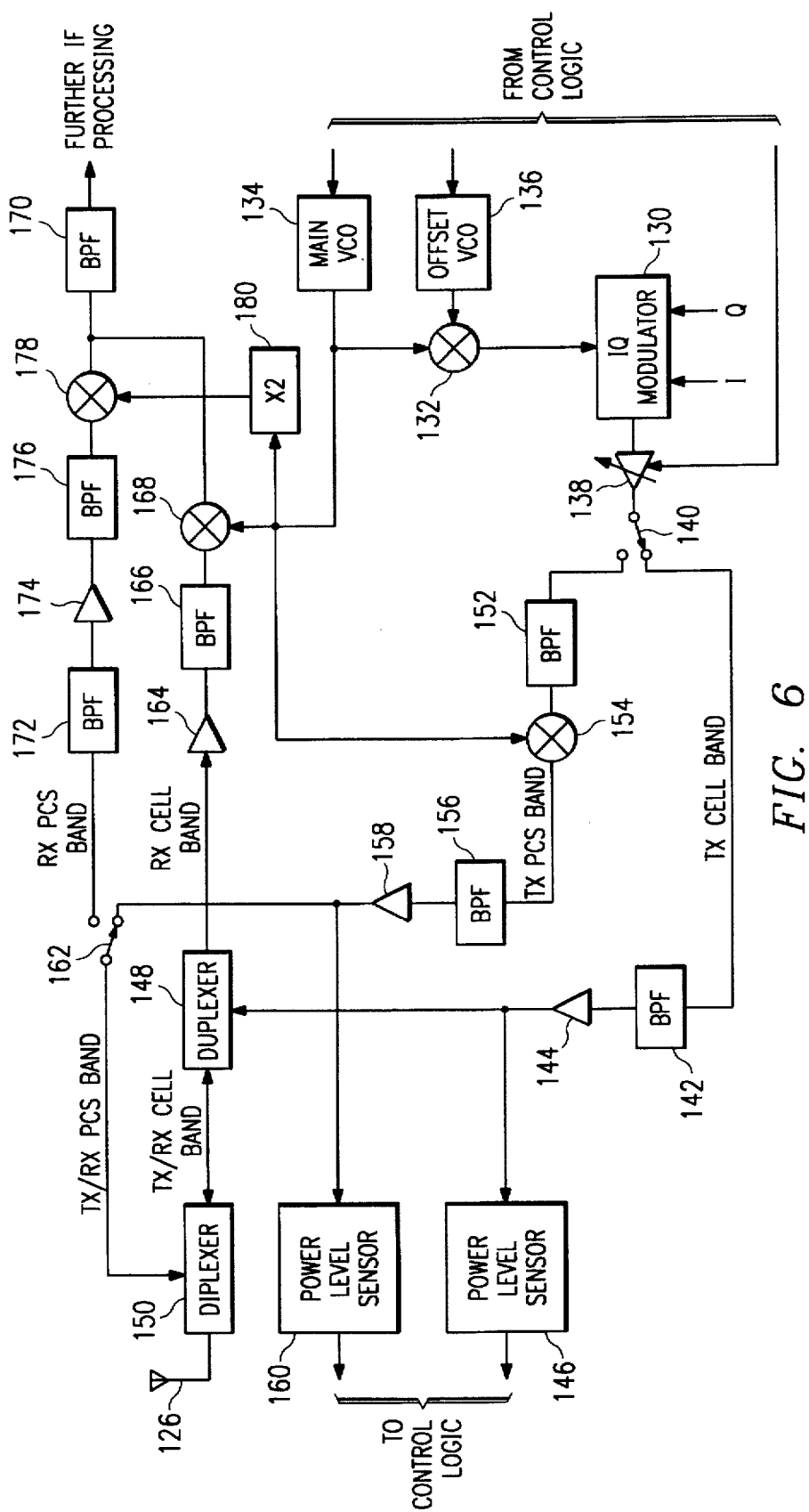
FIG. 6 is a circuit diagram of the dual band transceiver shown generally in FIG. 5.

FIG. 6 shows a more detailed circuit diagram of the RF section (dual band transmitter 108, dual band receiver 118 and antenna interface 124) of the mobile station first depicted generally in FIG. 5. In the transmit direction, the I and Q signals from the sample interface 106 (FIG. 5) are applied to an IQ modulator 130. The other input to the IQ modulator 130 is the output of a mixer 132 which combines the signal from a main (local) voltage controlled oscillator (VCO) 134 with the signal from an offset VCO 136. The main VCO 134 and the offset VCO 136 are both controlled by logic in the microprocessor 120 (FIG. 5), as generally shown in FIG. 6. In a preferred embodiment, the main VCO 134 is designed to be programmable to any frequency (RF channel) between 980 MHz and 1050 MHz (with 30 KHz channel spacing), while the offset VCO 136 is set to 155.52 MHz and 190.56 MHz for operation in the cell band and the PCS band, respectively.

With continuing reference to FIG. 6, the output of the IQ modulator 130 is fed to a variable gain amplifier 138 which is also controlled by the microprocessor 120 (FIG. 5). The variable gain amplifier 138 is used to control the output level of the transmit signal. Depending on whether the mobile station is operating in the cell band or, alternatively, the PCS band, the signal from the variable gain amplifier 138 will be directed by a switch 140 to an appropriate transmit path. For operation in the cell band, the switch 140 directs the signal to a band pass filter (BPF) 142 in the cell band transmit path. The BPF 142 removes from the transmit signal any noise or spurious signals and the undesired signal products generated in the mixer 132. The output of the BPF 142 is then supplied to a power amplifier 144 to increase the power of the transmit signal to the desired level. The signal level at the output of the power amplifier 144 is detected by a power level sensor 146 which generates a feedback signal to the microprocessor 120 (FIG. 5) for use in adjusting the gain in the variable gain amplifier 138. The output of the power amplifier 144 is provided to a duplexer 148 and then to a diplexer 150 for ultimate transmission through the antenna 126 (FIGS. 5–6). The duplexer 148 is used to separate the cell band transmit signal from the incoming cell band receive signal so that the transmit and receive signals can be applied to the appropriate paths. The diplexer 150, on the other hand, is used to separate the cell band transmit and receive signals from the PCS band transmit and receive signals so that the cell band and PCS band signals can be applied to the appropriate paths. As well known in the art, each of the duplexer 148 and the diplexer 150 may be implemented with a plurality of BPFs.

For operation in the PCS band, the switch 140 directs the signal to a BPF 152 in the PCS band transmit path. The BPF 152 in the PCS band transmit path performs a function similar to the BPF 142 in the cell band transmit path. The output of the BPF 152 is fed to an upconversion mixer 154 whose other input is provided by the main VCO 134. This second mixing of the signal from the IQ modulator 130 with the signal from the main VCO 134 (the first mixing being provided by the mixer 132) upconverts the transmit signal to the desired frequency in the PCS band. The PCS transmit signal from the upconversion mixer 154 is filtered in a BPF 156 to remove any undesired signal products generated in the upconversion mixer 154. The output of the BPF 156 is then amplified in a power amplifier 158 whose output is detected by a power level sensor 160. The power amplifier 158 and the power level sensor 160 in the PCS band transmit path perform functions similar to those performed by the power amplifier 144 and the power level sensor 146, respectively, in the cell band transmit path. The output of the power amplifier 158 is supplied to a switch 162 which feeds the transmit signal to the diplexer 150 during the transmit time slots defined in a TDMA system, such as the D-AMPS system specified by IS-136.

The operation of the transmit paths for the cell band and the PCS band in FIG. 6 will now be illustrated by specific examples of RF channels drawn from FIGS. 3–4. Assume that the mobile station is operating on channel 500 in the cell band, which corresponds to a transmit frequency of 840 MHz (FIG. 3). The main VCO 134 is programmed to a frequency of 995.52 MHz, and the offset VCO 136 is set to a frequency of 155.52 MHz (FIG. 6). These two signals are combined in the mixer 132 to produce sum and difference frequencies of 1151.04 MHz and 840 MHz, respectively, as will be readily appreciated by persons of ordinary skill in the art. The resulting sum and difference signals are applied to the IQ modulator 130, amplified in the variable gain amplifier 138, and then directed by the switch 140 to the cell band transmit path. The sum frequency of 1151.04 MHz is then filtered out in the BPF 142 leaving the desired difference frequency of 840 MHz for transmission via the antenna 126 as described above.

Assume, on the other hand, that the mobile station is operating on channel 500 in the PCS band, which corresponds to a transmit frequency of 1864.98 MHz (FIG. 4). The main VCO 134 is programmed to a frequency of 1027.77 MHz, and the offset VCO 136 is set to a frequency of 190.56 MHz (FIG. 6). These two signals are combined in the mixer 132 to produce sum and difference frequencies of 1218.33 MHz and 837.21 MHz, respectively. The resulting sum and difference signals are modulated in the IQ modulator 130, amplified in the variable gain amplifier 138 and then directed by the switch 140 to the PCS band transmit path. The sum frequency of 1218.33 MHz is first filtered out in the BPF 152 and the remaining difference frequency of 837.21 MHz is then fed to the upconversion mixer 154 where it is mixed once again with the 1027.77 MHz signal from the main VCO 134. This second mixing produces sum and difference frequencies of 1864.98 MHz and 190.56 MHz, respectively. The difference frequency of 190.56 MHz is filtered out in the BPF 156 leaving the desired sum frequency of 1864.98 MHz for transmission via the antenna 126 as described above.

The receive operation in the cell band and the PCS band mirrors to some extent the corresponding transmit operation. During cell band reception, the received signal is supplied from the duplexer 148 to a linear amplifier 164 followed by a BPF 166 which attenuates out-of-band noise (including noise introduced by the linear amplifier 164) and other spurious signals. The output of the BPF 166 is fed to an IF mixer 168 which combines the received cell band signal with the signal from the main VCO 134. This mixing stage downconverts the received cell band signal to a first IF frequency which is now provided to a BPF 170, and then further processed and downconverted to produce a baseband audio signal in a manner generally consistent with FIG. 5.

During PCS band reception, on the other hand, the received signal is directed by the switch 162 to a BPF 172 which is used to filter out signal components outside of the PCS band. The output of the BPF 172 is supplied to a linear amplifier 174 followed by a BPF 176 which further attenuates out-of-band noise (including noise introduced by the linear amplifier 174) and other spurious signals. The output of the BPF 176 is fed to an IF mixer 178 which combines the received PCS band signal with the signal from a frequency doubler 180, which is used to double the frequency of the LO signal from the main VCO 134. Since the frequency of the received PCS band signal is roughly twice the frequency of the LO signal from the main VCO 134, this mixing stage downconverts the received PCS band signal to a first IF frequency, which is now passed through the BPF 170 and then supplied for further IF processing and downconversion in a manner similar to the received cell band signal.

It can thus be seen that the present invention allows the sharing of a number of radio hardware components for operation in the cell and PCS bands (e.g., components preceding and including the IQ modulator 130 in the transmit direction, and components including and following the BPF 170 in the receive direction). It can also be seen that, with the present invention, a cellular mobile station can be redesigned to provide the capability to transmit in the PCS band through relatively little additional hardware (e.g., the BPF 152 and the mixer 154). Another benefit of the present invention derives from the use of the BPF 152 before the upconversion mixer 154, which facilitates compliance with the strict requirements on spurious emissions in the PCS band since the BPF 152 filters the PCS transmit signal at a lower frequency and, thus, can be implemented with a smaller bandwidth (passband) filter than would be required for equivalent filtering in the PCS band.

It will be further appreciated that, in accordance with the present invention, many operational or structural modifications may be made by persons of ordinary skill to the basic circuit of FIG. 6. For example, because the transmit-receive channel separation is 45 MHz in the cell band and 80.04 MHz in the PCS band (a difference of 35.04 MHz), the frequency of either the main VCO 134 or the offset VCO 136 should be changed when switching between cell band and PCS band operation. In the preferred embodiment of the present invention, the frequency of the offset VCO 136 is changed. Specifically, the frequency of the offset VCO 136 is set to 155.52 MHz for cell band operation, and 190.56 MHz for PCS band operation (these two settings also differing by 35.04 MHz). However, it is also possible to fix the frequency of the offset VCO 136 at 155.52 MHz, for example, and to account for the difference in the transmit-receive channel separation by appropriate programming of the main VCO 134 (i.e., "hopping" the main VCO 134 instead of the offset VCO 136).

As another example of a possible modification to the circuit of FIG. 6, which is also encompassed by the present invention, the mixer 132 can be moved from the input to the output of the IQ modulator 130 (e.g., before the variable gain amplifier 138) without affecting the dual band operation of the circuit. In this case, the IQ modulator 130 would receive either the signal from the main VCO 134 or the signal from the offset VCO 136 (in addition to receiving the IQ signals), and the mixer 132 would receive the other VCO signal (in addition to receiving the modulated signal from the IQ modulator 130). Preferably, the signal from the main VCO 134 is fed to the mixer 132 and the signal from the offset VCO 136 is fed to the IQ modulator 130 so that the modulation of the IQ signals occurs at a lower frequency (thus resulting in fewer undesirable signal products).

As yet another example of a possible variation on the circuit of FIG. 6, an image reject mixer could be used for implementing the mixer 132 so that only the desired difference frequency is supplied from the mixer 132 to the IQ modulator 130. Alternatively, a suitable filter could be used at the output of the mixer 132 to filter out the undesired sum frequency.

In general, those skilled in the art will readily recognize that many modifications and variations may be made to the embodiments of the present invention disclosed herein without substantially departing from the spirit and scope of the present invention. Accordingly, the form of the invention disclosed herein is exemplary, and is not intended as a limitation on the scope of the invention as defined in the following claims.

We claim:

1. A dual band transmitter for transmitting a data signal in a first lower frequency band or a second higher frequency band, the dual band transmitter comprising:

a first oscillating means for generating a local oscillator (LO) signal;

a second oscillating means for generating an offset frequency (OF) signal;

a first mixing means for combining said LO signal with said OF signal to produce a first transmit signal;

modulation means for modulating said first transmit signal with said data signal to produce a first data modulated transmit signal;

a second mixing means for combining said first data modulated transmit signal with said LO signal to produce a second data modulated transmit signal;

means for programming said first oscillating means and said second oscillating means such that said first data modulated transmit signal is in said first band and said second data modulated transmit signal is in said second band; and means for transmitting said first data modulated transmit signal when transmitting in said first band, and for transmitting said second data modulated transmit signal when transmitting in said second band.

2. The dual band transmitter of claim 1 wherein said first band is a transmit band used by cellular systems, and said second band is a transmit band used by personal communication services (PCS) systems.

3. The dual band transmitter of claim 2 wherein said cellular transmit band extends from 824 MHz to 849 MHz and said PCS transmit band extends from 1850 MHz to 1910 MHz.

4. The dual band transmitter of claim 3 wherein said LO signal is selectively set to a frequency between 980 MHz and 1050 MHz, and said OF signal is set to 155.52 MHz when transmitting in said cellular transmit band and reset to 190.56 MHz when transmitting in said PCS transmit band.

5. The dual band transmitter of claim 3 wherein said OF signal is set to 155.52 MHz when transmitting in either said cellular transmit band or said PCS transmit band.

6. A dual band transmitter for transmitting a data signal in a first lower frequency band or a second higher frequency band, the dual band transmitter comprising:
   a first oscillating means for generating a local oscillator (LO) signal;
   a second oscillating means for generating an offset frequency (OF) signal;
   modulation means for modulating one of said LO signal and said OF signal with said data signal to produce a data modulated signal;
   a first mixing means for combining the other of said LO signal and said OF signal with said data modulated signal to produce a first data modulated transmit signal;
   a second mixing means for combining said first data modulated transmit signal with said LO signal to produce a second data modulated transmit signal;
   means for programming said first oscillating means and said second oscillating means such that said first data modulated transmit signal is in said first band and said second data modulated transmit signal is in said second band; and
   means for transmitting said first data modulated transmit signal when transmitting in said first band, and for transmitting said second data modulated transmit signal when transmitting in said second band.

7. The dual band transmitter of claim 6 wherein said first band is a transmit band used by cellular systems, and said second band is a transmit band used by personal communication services (PCS) systems.

8. The dual band transmitter of claim 7 wherein said cellular transmit band extends from 824 MHz to 849 MHz and said PCS transmit band extends from 1850 MHz to 1910 MHz.

9. The dual band transmitter of claim 8 wherein said LO signal is selectively set to a frequency between 980 MHz and 1050 MHz, and said offset frequency signal is set to 155.52 MHz when transmitting in said cellular transmit band and reset to 190.56 MHz when transmitting in said PCS transmit band.

10. The dual band transmitter of claim 8 wherein said OF signal is set to 155.52 MHz when transmitting in either said cellular transmit band or said PCS transmit band.

11. A dual band mobile station capable of operating in a first lower frequency band or a second higher frequency band, and comprising:
    means for detecting an analog voice signal;
    means for processing said analog voice signal into a digital baseband data signal; and
    dual band transmitting means for transmitting said baseband data signal in said first band or said second band, the dual band transmitting means including:
    a first oscillating means for generating a local oscillator (LO) signal;
    a second oscillating means for generating an offset frequency (OF) signal;
    a first mixing means for combining said LO signal with said OF signal to produce a first transmit signal;
    modulation means for modulating said first transmit signal with said baseband data signal to produce a first data modulated transmit signal;
    a second mixing means for combining said first data modulated transmit signal with said LO signal to produce a second data modulated transmit signal;
    means for programming said first oscillating means and said second oscillating means such that said first data modulated transmit signal is in said first band and said second data modulated transmit signal is in said second band; and
    means for transmitting said first data modulated transmit signal when transmitting in said first band, and for transmitting said second data modulated transmit signal when transmitting in said second band.

12. The mobile station of claim 11 further comprising dual band receiving means for receiving a data modulated signal in said first or second band, the dual band receiving means including:
    a third mixing means for combining said received first band signal with said LO signal;
    a frequency multiplier for upconverting said LO signal; and
    a fourth mixing means for combining said received second band signal with said upconverted LO signal.

13. The mobile station of claim 12 wherein said first band comprises a transmit band and a receive band allocated to cellular systems, and said second band comprises a transmit band and a receive band allocated to personal communication services (PCS) systems.

14. The mobile station of claim 13 wherein said cellular transmit band extends from 824 MHz to 849 MHz, said cellular receive band extends from 869 MHz to 894 MHz, said PCS transmit band extends from 1850 MHz to 1910 MHz, and said PCS receive band extends from 1930 MHz to 1990 MHz.

15. The mobile station of claim 14 wherein said frequency multiplier is a frequency doubler.

16. A dual band mobile station capable of operating in a first lower frequency band or a second higher frequency band, and comprising:
    means for detecting an analog voice signal;
    means for processing said analog voice signal into a digital baseband data signal; and
    dual band transmitting means for transmitting said baseband data signal in said first band or said second band, the dual band transmitting means including:
    a first oscillating means for generating a local oscillator (LO) signal;
    a second oscillating means for generating an offset frequency (OF) signal;
    modulation means for modulating one of said LO signal and said OF signal with said baseband data signal to produce a data modulated signal;
    a first mixing means for combining the other of said LO signal and said OF signal with said data modulated signal to produce a first data modulated transmit signal;
    a second mixing means for combining said first data modulated transmit signal with said LO signal to produce a second data modulated transmit signal;

means for programming said first oscillating means and said second oscillating means such that said first data modulated transmit signal is in said first band and said second data modulated transmit signal is in said second band; and means for transmitting said first data modulated transmit signal when transmitting in said first band, and for transmitting said second data modulated transmit signal when transmitting in said second band.

17. The mobile station of claim 16 further comprising dual band receiving means for receiving a data modulated signal in said first or second band, the dual band receiving means including:

a third mixing means for combining said received first band signal with said LO signal;

a frequency multiplier for upconverting said LO signal; and a fourth mixing means for combining said received second band signal with said upconverted LO signal.

18. The mobile station of claim 17 wherein said first band comprises a transmit band and a receive band allocated to cellular systems, and said second band comprises a transmit band and a receive band allocated to personal communication services (PCS) systems.

19. The mobile station of claim 18 wherein said cellular transmit band extends from 824 MHz to 849 MHz, said cellular receive band extends from 869 MHz to 894 MHz, said PCS transmit band extends from 1850 MHz to 1910 MHz, and said PCS receive band extends from 1930 MHz to 1990 MHz.

20. The mobile station of claim 19 wherein said frequency multiplier is a frequency doubler.

21. A method for transmitting a data signal in a first lower frequency band or a second higher frequency band, the method comprising the steps of:

generating a local oscillator (LO) signal;

generating an offset frequency (OF) signal;

mixing said LO signal with said OF signal to produce a first transmit signal;

modulating said first transmit signal with said data signal to produce a first data modulated signal;

if said data signal is to be transmitted in said first band, selecting said LO signal and said OF signal such that said first data modulated transmit signal is in said first band, and transmitting said data modulated first band signal; and if said data signal is to be transmitted in said second band, mixing said first data modulated transmit signal with said LO signal to produce a second data modulated transmit signal, selecting said LO signal and said OF signal such that said second data modulated transmit signal is in said second band, and transmitting said second data modulated transmit signal.

22. The method of claim 21 wherein said first data modulated transmit signal is filtered before being mixed with said LO signal to produce said second data modulated transmit signal.

23. The method of claim 22 wherein said first band is in the 800 MHz range and said second band is in the 1900 MHz range.

24. The method of claim 23 wherein said LO signal is selectively set to a frequency between 980 MHz and 1050 MHz, and said OF signal is set to 155.52 MHz when transmitting in said first band and reset to 190.56 MHz when transmitting in said second band.

25. The method of claim 23 wherein said OF signal is set to 155.52 MHz when transmitting in either said first band or said second band.

26. A method for transmitting a data modulated signal in a first lower frequency band or a second higher frequency band, the method comprising the steps of:

generating a local oscillator (LO) signal;

generating an offset frequency (OF) signal;

modulating one of said LO signal and said OF signal with said data signal to produce a data modulated signal;

mixing the other of said LO signal and said OF signal with said data modulated signal to produce a first data modulated transmit signal;

if said data signal is to be transmitted in said first band, selecting said LO signal and said OF signal such that said first data modulated transmit signal is in said first band, and transmitting said data modulated first band signal; and if said data signal is to be transmitted in said second band, mixing said first data modulated transmit signal with said LO signal to produce a second data modulated transmit signal, selecting said LO signal and said OF signal such that said second data modulated transmit signal is in said second band, and transmitting said second data modulated transmit signal.

27. The method of claim 26 wherein said first data modulated transmit signal is filtered before being mixed with said LO signal to produce said second data modulated transmit signal.

28. The method of claim 27 wherein said first band is in the 800 MHz range and said second band is in the 1900 MHz range.

29. The method of claim 28 wherein said LO signal is selectively set to a frequency between 980 MHz and 1050 MHz, and said OF signal is set to 155.52 MHz when transmitting in said first band and reset to 190.56 MHz when transmitting in said second band.

30. The method of claim 28 wherein said OF signal is set to 155.52 MHz when transmitting in either said first band or said second band.

* * * * *